United States Patent [19]

Stitz

[11] Patent Number: 4,607,591

[45] Date of Patent: Aug. 26, 1986

[54] CVD HEATER CONTROL CIRCUIT

[75] Inventor: Robert W. Stitz, Mesa, Ariz.

[73] Assignee: Spectrum CVD, Inc., Phoenix, Ariz.

[21] Appl. No.: 762,757

[22] Filed: Aug. 6, 1985

[51] Int. Cl.$^4$ .............................................. B05C 11/00
[52] U.S. Cl. .................................. 118/666; 118/50.1;
118/724
[58] Field of Search ................. 118/666, 50.1, 724

[56] References Cited

U.S. PATENT DOCUMENTS 4,223,048 9/1980 Engle ................................. 427/39

Primary Examiner—Bernard D. Pianalto
Attorney, Agent, or Firm—Paul F. Wille

[57] ABSTRACT

Chemical vapor deposition on a semiconductor wafer is obtained in a plasma reactor having a plurality of lamps for radiantly heating the wafer. Calibrated temperature sensing means remote from the wafer is used to control the heating of the wafer. Gases are supplied by way of a plurality of tubes extending radially inwardly from the sides of the chamber. A baffle is provided to form an antechamber which aids in the uniformity of the deposition. The plasma is ignited for less than the whole deposition cycle for deposition of tungsten disilicide.

5 Claims, 9 Drawing Figures

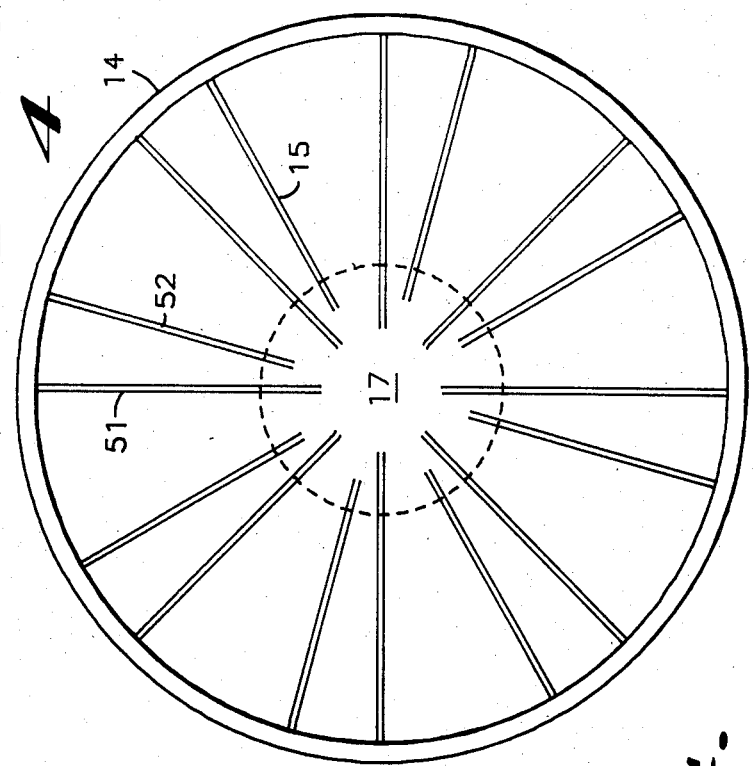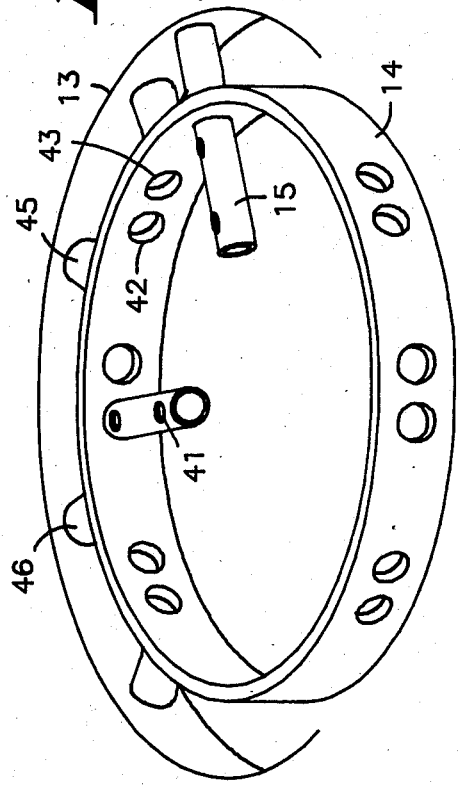

CVD HEATER CONTROL CIRCUIT

BACKGROUND OF THE INVENTION

This invention relates to plasma treatment of an article and, in particular, to plasma enhanced chemical vapor deposition (CVD).

The use of plasma reactors for various etching processes is well known in the art. Also known, but less frequently exploited, is the use of plasma reactors for deposition, e.g. a conductive or insulating layer on a semiconductor wafer. While the advantages of planar plasma reactors are well known, e.g. U.S. Pat. No. 4,223,048, they are not free from problems. Some problems are inherent in the process itself. For example, silane ($SiH_4$) deposits silicon everywhere, once a minimum temperature is reached. The contamination problems are obvious. Silicon tetrachloride ($SiCl_4$) will not deposit silicon by itself and has a higher minimum deposition temperature. Intermediate compounds, e.g. dichlorosilane ($SiH_2Cl_2$), have intermediate characteristics. Thus, one is faced with the problem of switching or mixing gases during a process, yet trying to obtain consistent results.

Another source of difficulty, in a sense, is the semiconductor industry itself. There is a constant demand for better results, e.g. uniformity, through-put, deposition rate. Improving both uniformity and deposition rate, for example, is not easy. Further, there are several kinds of uniformity. A first relates to the wafer itself. A second concerns from wafer to wafer in a given batch. A third kind relates to uniformity from batch to batch. For single wafer plasma reactors, the latter two are the same since the wafers are processed singly. As can be seen, improving one parameter may not be particularly difficult. Improving all of them is a feat.

Another consideration is the increased use of automation. As known, it is highly desirable to process a plurality of wafers at a time in a vacuum. Thus, vacuum load locks and vacuum transports are being used more frequently. This leads to the desire to process wafers more quickly, e.g. at higher deposition rates, to match more closely the increased speed of the wafer transports. Thus, not only must the process be improved, but the chamber in which the process takes place must be compatible with vacuum load locks and transports as well.

In view of the foregoing, it is therefore an object of the present invention to provide improved plasma deposition apparatus.

Another object of the present invention is to provide an improved plasma deposition process in which both deposition rate and uniformity are improved for single wafer deposition in an automated vacuum load lock convertible for wafer diameters of 3-10 inches.

A further object of the present invention is to provide improved means for heating a semiconductor wafer.

A further object of the present invention is to provide improved means for controlling gas flow in a deposition chamber.

Another object of the present invention is to provide improved temperature sensing means for deposition apparatus.

A further object of the present invention is to provide improved control means for radiantly heating a wafer.

Another object of the present invention is to provide a process chamber compatible with vacuum transport apparatus.

SUMMARY OF THE INVENTION

The foregoing objects are achieved in the present invention wherein a plasma reactor comprises a chamber having an annular baffle positioned to divide the chamber into an antechamber and a reaction chamber. Positioned about the periphery of the reaction chamber are gas supply and exhaust ports. The gas supply ports include extenders which project radially inwardly. An annular wall extends from the baffle into the reaction chamber. The extenders pass through the wall and are supported thereby. The baffle is separated from the periphery of the chamber by a gap. The baffle comprises a central aperture. Gases can circulate between the antechamber and the reaction chamber through the gap and the aperture.

The wafer is held on a quartz window to which a heater means is attached. The heater comprises lamps resiliently mounted on a conductive member but electrically isolated from the conductive member.

Temperature sensing means are mounted in the conductive member on the opposite side of the lamps from the wafer.

The process is based upon the discovery that the plasma impedes deposition. In accordance with the present invention, the plasma is ignited for less than the whole deposition cycle.

In the process, the wafer is brought up to a predetermined temperature by applying full power to the lamps. At a predetermined temperature, as detected by the temperature sensor and related circuitry, the power to the lamps is reduced to an amount sufficient to maintain the temperature of the wafer. The deposition gas is supplied to the chamber and a plasma is ignited. The plasma is terminated and the deposition continues. After a predetermined length of time the deposition gas is stopped and the lamps are turned off. The wafer is then cooled and removed.

BRIEF DESCRIPTION OF THE DRAWINGS

A more complete understanding of the present invention can be obtained by considering the following detailed description in conjunction with the accompanying drawings, in which:

FIG. 3 illustrates a portion of the baffle and extenders in accordance with the present invention.

FIG. 4 illustrates the orientation of the extenders in accordance with the present invention.

FIG. 5 illustrates an alternative embodiment of a deposition chamber in accordance with the present invention.

DETAILED DESCRIPTION OF THE INVENTION

Figure 1:
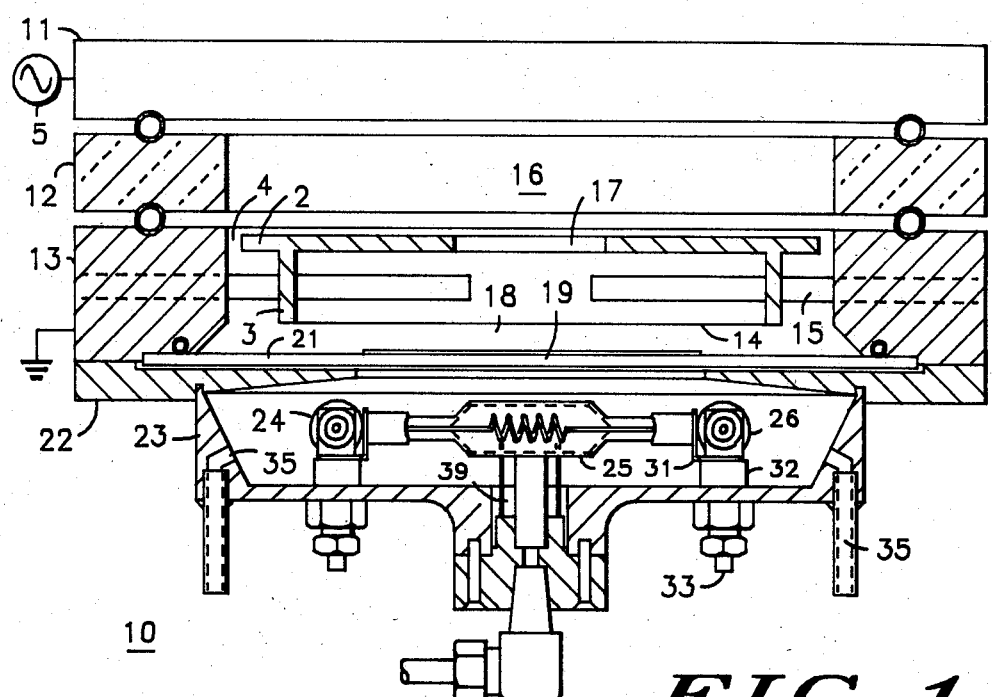
FIG. 1 illustrates a deposition chamber in accordance with the present invention.

FIG. 1 illustrates a preferred embodiment of a reactor chamber for plasma enhanced chemical vapor deposition. In accordance with the present invention two chambers separated by a baffle are provided in which the reactor chamber, containing the semiconductor wafer, is separated from the antechamber, wherein the plasma is generated, by an aperture smaller than the diameter of the wafer.

In particular, reactor 10 comprises an upper electrode 11 which is attached to insulating member 12 by suitable means, not shown. Insulating member 12 preferably comprises an annular ring having grooves on each major surface thereof for receiving a suitable sealing member, such as an O-ring. Insulating member 12 is mechanically connected to conductive member 13 which also preferably comprises an annular ring. Conductive member 13 contains the gas supply and exhaust lines, as further described herein, and suitable cooling means, well known per se to those of skill in the art. Members 12 and 13 form the sidewall of the reactor and need not be the same thickness. Typical thicknesses, for a reactor for depositing on four inch diameter wafers, are 0.5 inches for insulating member 12 and 0.5 inches for conductive member 13. The central apertures of each of these members are typically 6 inches in diameter, for a four inch diameter wafer, although they need not be identical.

Within the space defined by conductive member 13, is baffle means 14 which comprises a generally planar portion 2 and an annular wall portion 3. Planar portion 2 is separated from conductive member 13 by a predetermined distance 4, e.g. 100 mils. Wall 3 is separated from conductive member 13 by a predetermined distance, typically 300 mils, for a system depositing layers on four inch wafers. As with the other dimensions given herein, the height of annular wall 3 depends upon the size and geometry of chamber. A height of 0.5 inches has been found suitable for a chamber depositing layers on four inch wafers.

Conductive member 13 comprises a plurality of gas supply and exhaust ports, more fully illustrated in FIG. 3. Connected to the gas supply ports are extenders such as extender 15 as illustrated in FIG. 1. Extender 15 is connected to conductive member 13 and extends through a suitably sized bore in wall 3. Planar portion 2 of baffle 14 comprises an aperture 17, e.g. having a diameter of 3 inches and approximately centered therein. As thus constructed, reactor 10 comprises an antechamber 16 and a reactor chamber 18 which contains wafer 19. These chambers communicate by way of aperture 17 and gap 4 about the periphery of baffle 14.

Wafer 19 rests upon a thermally translucent or transparent, insulating member 21, which preferably comprises quartz, held in place by frame 22. Insulating member 21 serves to close chamber 18 about wafer 19. Member 21 also provides a window through which wafer 19 can be radiantly heated.

The radiant heating portion of reactor 10 comprises a plurality of lamps 24, 25 and 26 mounted on a cup-shaped, conductive member 23 which serves to enclose the lamps and contains suitable passageways for the supply and exhausting of a cooling gas or air. Lamps 24-26 preferably comprise halogen lamps, which are rich in infrared radiation, such as ANSI type DXW, a 120 volt 1000 watt lamp. In a preferred embodiment of the present invention, there is a fourth lamp, not shown, positioned opposite lamp 25 and in a generally symmetrical relationship with the other lamps about the center of the chamber. Lamps 24-26 are resiliently mounted by means of angle bracket means 31 and attached to insulating feedthrough member 32 by way of conductive bolt 33. Cup 23 is preferably gold plated to increase the reflection of infra-red radiation.

As thus constructed, the lamps are attached securely to conductive member 33 but yet are resiliently mounted so that, during the considerable expansion the lamps undergo when turned on, reliable contact is made to the lamps without compressively stressing the lamps. Insulating feedthrough 32 serves to isolate the power applied to the lamps from cup 23.

Mounted within cup 23, but thermally isolated from cup 23, is thermocouple 39 which is mounted on a small disk of predetermined mass to simulate the mass of wafer 19. During a typical process run, a silicon wafer must be heated to and kept at a temperature of approximately 400° C. Direct monitoring and control of this temperature is very difficult due to the presence of reactive gases, a high frequency electric field, and the need to maintain a good vacuum seal. In accordance with the present invention, thermocouple 39, mounted on a disk of predetermined mass, simulates the heating of the wafer and provides a relatively simple means for monitoring and controlling the temperature of the wafer.

Figure 2:
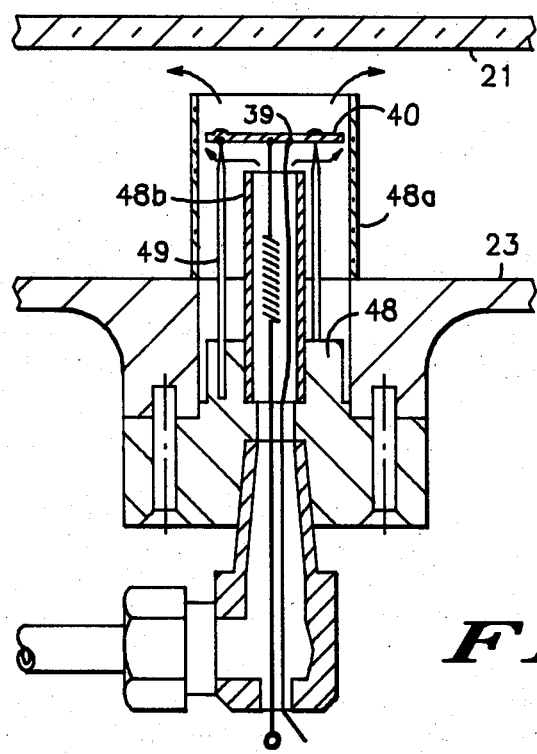
FIG. 2 illustrates a portion of the temperature sensor in accordance with the present invention.

FIG. 2 illustrates in greater detail the construction of the temperature sensor in accordance with the present invention. Thermocouple 39 is attached to disk 40 which comprises, for example, anodized aluminum, ceramic, or graphite. In general, disk 40 can comprise any low reflectance, low specific heat material. Disk 40 is thermally isolated from fitting 48 by a plurality of pins, such as pin 49, and is dimpled to facilitate locating the disk on the pins. Disk 40 is surrounded by thermally transparent tube 48a which isolates disk 40 from the cooling air for the lamps. Tube 48a extends to, but does not touch, window 21. Approximately centrally located in fitting 48 is tube 48b, which conveys cooling air to disk 40. This air is not continuously provided and is referred to as "reset air" to distinguish it from the air for cooling the lamps. As more fully described herein, the reset air is used to bring disk 40 to a reference temperature. Once the temperature is achieved, the process cycle can begin and, when begun, the reset air is shut off so that disk 40 can increase in temperature.

Thermally transparent tube 48a preferably comprises quartz and tube 48b preferably comprises stainless steel. Tube 48b conveniently provides access for the leads to thermocouple 39 and a means for spring-loading disk 40 to hold it in place against pins 49. As more fully described herein, the choice of thermocouple depends upon the temperature range of disk 40. Typical materials include chromel-alumel and platinum-platinum/rhodium.

In accordance with the present invention, upper electrode 11 is connected to source 5 of RF power, e.g. up to several hundreds watts at a frequency of 13.56 MHz. It is understood by those of skill in the plasma deposition art that other frequencies and power ranges may be used. Conductive member 13 is preferably grounded, thereby reducing the tendency for plasma discharge to enter the supply or exhaust lines.

FIG. 3 illustrates a portion of the baffle extenders in accordance with the present invention. Specifically, conductive member 13 has extender 15 fastened thereto and passing through a suitable hole in wall 3 of baffle 14. A plurality of holes such as holes 42 and 43 are provided approximately regularly about wall 3 to assure relative uniformity in the distribution of gases within the chambers. Similarly, exhaust ports 45 and 46, and others, are preferably uniformly distributed about the interior face of conductive member 13. Extender 15, and the other extenders, comprise hollow tubes having sealed ends and bores in the upper portion thereof for releasing the gas within chamber 18, away from wafer 19, and within aperture 17. This is believed to improve the mixing of the gases and improves the uniformity of the deposition on wafer 19.

As illustrated in FIG. 4, the extenders are not all of the same length but are varied in length to improve the uniformity of the deposition. As illustrated in FIG. 4 two adjacent extenders, 51 and 52, are of unequal length and comprise one pair of several pair extending radially inwardly from wall 3 on baffle 14. While illustrated as having this particular pattern in FIG. 4, it is understood by those of skill in the art that various other configurations can be employed. For example, extenders of three different lengths could be used or extenders of two different lengths could be arranged in bilaterally symmetrical groups of fours.

As illustrated in FIG. 5, the reactor of the present invention can be inverted to accommodate various wafer transport systems for automatic processing of wafers. To accomplish this, a portion of the reactor is movable to provide clearance for the transport. Specifically, the reactor is split at lamp housing 60 which is fixed and forms the upper part of the chamber. The remainder of the chamber is lowered so that a wafer can be inserted, e.g. by a spatula from the transport mechanism (not shown). The reactor of FIG. 5 contains all the elements shown in FIG. 1, although several are omitted from the figure for the sake of simplicity. The principal difference between FIGS. 1 and 5 is the use of tines 67, 68 to hold wafer 19 against the window in lamp housing 60. The actual number of tines is not critical, although at least three are necessary to hold the wafer.

When reactor chamber and antechamber are lowered, as indicated by the dotted lines, tines 67 and 68 extend upwardly, above the sealing plane, so that the wafer can be placed or retrieved by the transport mechanism. When the chambers are raised, wafer 19 is held tightly against the window so that deposition occurs on the lower side of the wafer. The tines are cantilever mounted in the wall of the chamber and extend across the edge of wafer 19 only far enough to assure reliable wafer transfers. Inverted operation reduces contamination on the wafer surface.

Figure 6:
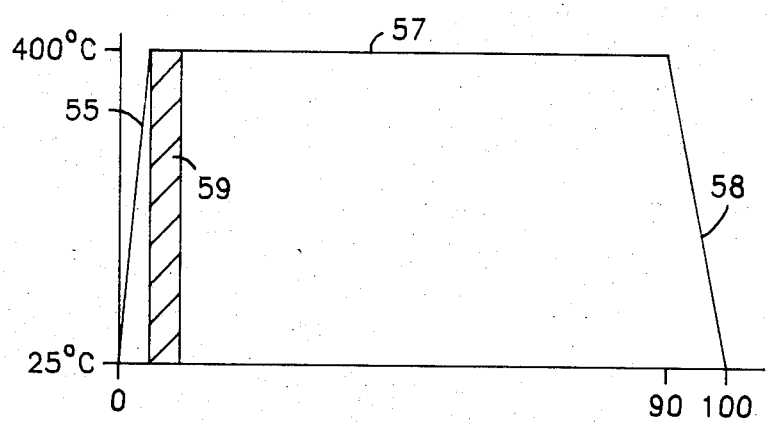
FIG. 6 illustrates a deposition process in accordance with the present invention.

The operation of the plasma reactor in accordance with the present invention may better be understood by considering FIG. 6 in which the heating and plasma discharge times are illustrated. During the deposition cycle, wafer 19 is heated to a predetermined temperature as illustrated by curve 55. Once that temperature is achieved, for example approximately 400° C., the power applied to lamps 24–26 is reduced to maintain wafer 19 at a relatively uniform temperature. During this time a glow discharge is ignited within the antechamber to provide reactive species which contact wafer 19 and initiate the deposition cycle. It has been found that the plasma discharge appears necessary to initiate/nucleate deposition but detrimental to the continuation of deposition of tungsten disilicide. In accordance with the present invention the glow discharge is terminated after a predetermined length of time illustrated in FIG. 6 by cross-hatched area 59. The deposition process continues, however because wafer 19 is maintained at a temperature above the dissociation temperature of the reactive gases. After a further predetermined length of time, determined in part by the desired thickness for the deposited layer, the applied power to lamps 24–26 is reduced to zero and wafer 19 is permitted to cool as illustrated by curve 58.

Figure 7:
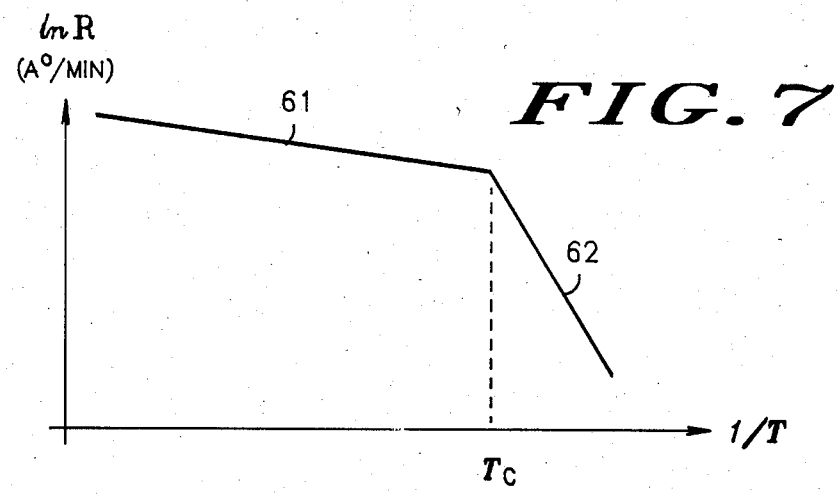
FIG. 7 illustrates a gas deposition characteristic used in the present invention.

The control of the temperature of the wafer is made less critical, in accordance with the present invention, by choosing a suitable deposition temperature above a predetermined minimum. As illustrated in FIG. 7 the deposition rate in a given process is temperature dependent. It has been found that the temperature dependency follows an Arrhenius plot; i.e. deposition is proportional to e (the natural logarithm base) raised to a power of the negative reciprocal of the absolute temperature. The slope of this curve is proportional to the apparent activation energy for this reaction. The curve can be generalized as a first line having a relatively shallow slope such as line 61, and a second line having a considerably steeper slope such as illustrated by line 62. In accordance with the present invention, one maintains the temperature of wafer 19 above temperature $T_c$ as illustrated in FIG. 7 wherein the deposition rate varies gradually with temperature change. Thus one obtains a system in which the control of temperature, while important, is not critical for film thickness control so long as a minumum deposition temperature is exceeded.

Figure 8:
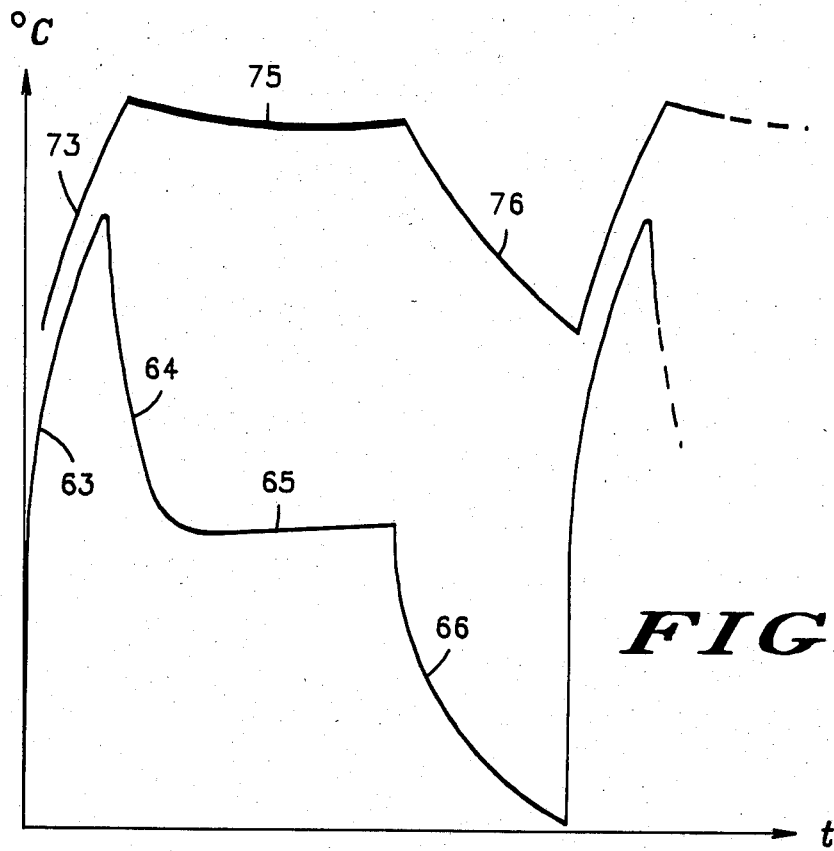
FIG. 8 illustrates temperature sensing in accordance with the present invention.

The control of the temperature of the wafer is not quite as idyllic as represented in FIGS. 6 and 7. FIG. 8 illustrates the temperatures as seen by wafer 19, in the upper curve, and as seen by thermocouple 39, in the lower curve. The process in accordance with the present invention can best be understood by considering FIGS. 1, 6 and 7 together.

Since heat and temperature are thermodynamically separate entities, maximum precision is obtained in accordance with the present invention when wafer 19 and sensor 39 begin the process cycle at known temperatures. Wafer 19 is typically at room temperature, 20° C. Sensor 39 is brought to a predetermined temperature by the application of reset air, previously described. When this temperature is achieved, an initial, low power is applied to lamps 24–26 to warm the lamp filaments and minimize the inrush current. After a brief period of time, e.g. two seconds, full power is applied to lamps 24–26 to bring wafer 19 up to deposition temperature. This is illustrated in FIG. 6 by curve 55 and is illustrated in FIG. 8 by curves 63 and 73.

Wafer 19 and disk 40 are both radiantly heated by lamps 24–26, the infrared energy of which is readily passed by quartz window 21 to wafer 19. Wafer 19 absorbs a substantial fraction of the incident energy and increases in temperature, as does disk 40. When a predetermined wafer temperature is achieved, e.g. 390°–400° C., the power applied to lamps 24–26 is reduced to a predetermined lower level sufficient to sustain the temperature of wafer 19.

As illustrated in FIG. 8, the temperature seen by thermocouple 39 drops substantially, as illustrated by curve 64, and then stabilizes at a lower temperature as illustrated by curve 65. The temperature of the disk drops due to radiant cooling and, to some extent, due to the cooling of lamps 24–26 by way of air or gas flowing through passageways 35. The temperature of wafer 19, on the other side of the window, is maintained at a relatively uniform level as illustrated by curve 75. Data for the curves illustrated in FIG. 8 have been obtained by substantial experiments wherein the temperature of the wafer was measured directly by a plurality of probes during the calibration of sensor 39.

The ratio of the temperature represented by the upper curve in FIG. 8 to the temperature represented by the lower curve in FIG. 8 depends upon a number of factors. Among these are the location, mass, reflectance, and specific heat of disk 40 as well as the process being run. By choice of material for disk 40, one can eliminate the peak formed by curves 63 and 64 and/or raise the level of curve 65.

Raising the temperature of disk 40 relative to wafer 19 has the theoretical effect of improving temperature control. For example, as illustrated in FIG. 8, a five degree error in disk temperature (curve 65) could amount to a ten or twelve degree error in wafer temperature (curve 75). If the disk temperature were higher than the wafer temperature, the error would be reduced. If graphite were used for disk 40, the temperature of the disk would go much higher during the process cycle than it does for an aluminum disk, even higher than the temperature of the wafer. However, the thermocouple material should also be changed, e.g. to platinum-rhodium/platinum, which tolerates higher temperatures but has a smaller temperature coefficient of resistance than chromel-alumel. Thus, the improvement is not as great as one might expect.

A reactive gas, e.g. dichlorosilane, is supplied by way of conductive member 13 and extenders 15 to reactor chamber 18. The gas also circulates through antechamber 13 wherein a plasma discharge is initiated. The supplied gas as well as gaseous by-products are exhausted by way of the ports in conductive member 13 postioned outside wall 3. Thus the flow in the chambers is broadly describable as a radial flow from the central portion to the periphery. As known per se in art, the dichlorosilane dissociates in the presence of heated wafer 19 to deposit silicon thereon. The plasma discharge serves to initiate the deposition of silicon.

Not only does the gas flow from a central area to the periphery, but the electric field lines do also. In general, the field diverges from upper electrode 11 to conductive member 13. This divergence reduces radiation damage to sensitive devices such as thin gate oxides. Despite the divergence of the field and of the gases, good uniformity is obtained. This is believed due in part to adjustment of the gas distribution and to the compactness of the chamber, approximately one half liter in volume for four inch wafers. Typical single wafer plasma reactors have a volume of five to seven liters. Ions traveling from the antechamber to the wafer do not have far to go in the chamber of the present invention.

Figure 9:
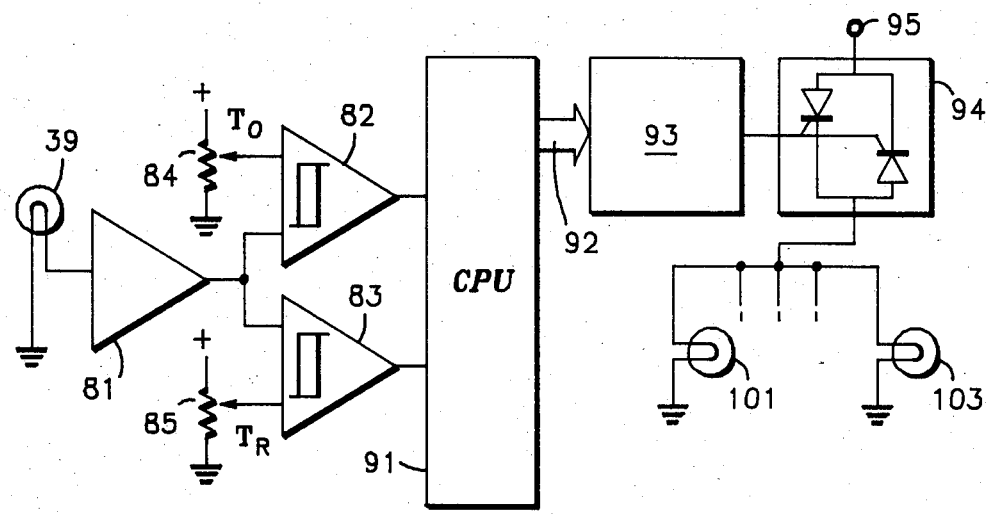
FIG. 9 illustrates control circuitry in accordance with the present invention.

FIG. 9 illustrates a circuit in which temperature sensing means, separated from the wafer by a window, produces a signal representative of the temperature of the wafer. Transducer means converts the signal to digital form and control means, connected to the lamps, regulate the power dissipated by the lamps in accordance with the digital signal.

The temperature of the wafer is simulated by thermocouple 39 and disk 40 as previously described. Thermocouple 39 is connected to operational amplifier 81 which provides suitable amplification and linearization characteristics for the thermocouple. Operational amplifier 81 is connected to threshold sensing amplifiers 82 and 83. Amplifiers 82 and 83 preferably include at least some hysteresis to prevent noise from causing the lamps to be energized intermittently. Comparator 82 is also connected to a source of variable voltage illustrated by potentiometer 84. Similarly comparator 83 has another input thereof connected to a source of variable voltage illustrated in FIG. 9 as potentiometer 85. Potentiometers 84 and 85 set the threshold sensed by comparators 82 and 83, respectively.

In operation, comparators 82 and 83 compare the voltage levels at the inputs thereof and produce an output signal indicative of which input has the greater voltage. One thus obtains a binary representation of the temperature sensed by thermocouple 39. This binary representation is applied to the inputs of a suitable microprocessor, illustrated in FIG. 9 has CPU 91. CPU 91 has an output thereof, illustrated as data bus 92, connected to an interface circuit 93 which provides the necessary isolation between CPU 91 and control circuit 94. Interface circuit 93 also contains zero crossing detectors for providing a signal to control circuit 94 which is synchronized with zero crossings of the A.C. powerline. Thus one can control power to the lamps by synchronous switching of half cycles of the applied power and can pick turn-on points with respect to zero crossings in the powerline. Control circuit 94 comprises devices such as silicon controlled rectifiers for switching high voltages and currents from a suitable source of power 95 to lamps 101 and 103.

Electrical components corresponding to the elements illustrated in FIG. 9 are well known per se to those of skill in the art and may often comprise but a single semiconductor device.

In operation the switching thresholds are set by potentiometers 84 and 85. The output from thermocouple 39 is amplified and linearized by amplifier 81 and applied to the other inputs of comparators 82 and 83. During the initial phase of the process, thermocouple 39 is cooled to a predetermined initial temperature as indicated by potentiometer 84. When this temperature is reached, the output from comparator 82 changes state, which change of state is sensed by CPU 91. CPU 91 then provides a signal to control circuit 94 by way of interface circuit 93 to turn on lamps 101 and 103 a predetermined amount.

After the lapse of a predetermined time, CPU 91 directs controller 94 to provide full power to lamps 101 and 103. Meanwhile, the temperature at thermocouple 39 is continuously monitored by comparators 82 and 83 which provide temperature setpoints to CPU 91. When CPU 91 receives a signal from comparator 83 indicating that the predetermined deposition temperature has been obtained, CPU 91 directs controller 94 to provide a reduced amount of power to lamps 101 and 103. Other inputs, not shown, to CPU 91 control the timing thereof, e.g. the duration of the process cycle. At the termination of the process cycle, CPU 91 directs controller 94 to remove power from lamps 101 and 103, thereby allowing wafer 19 to cool. During the cooling phase, an inert gas is provided to chambers 16 and 18 to enhance the cooling of wafer 19. Chambers 16 and 18 and then restored to atmospheric pressure so that wafer 19 can be removed.

As a specific example of the present invention, amorphous silicon was deposited at the rate of 0.09 microns per minute from dichlorosilane at a pressure of 200 millitorr at a flow of 92 SCCM at 500° C. with an applied RF power of 150 watts for 60 seconds. The deposited film had a thickness of 900 angstroms, an infinite resistivity, and a uniformity across the wafer of ±2.5%.

A second specific example of the present invention is deposition of tungsten disilicide from a mixture of dichlorosilane and tungsten hexaflouride at a rate of 2000 angstroms per minute, at a pressure of 150 millitorr, at a flow of 50 SCCM of dichlorosilane and 2.8 SCCM of tungsten hexaflouride at 450° C. The deposition film had a thickness of 2000 angstroms for a 60 second run, a deposited resistivity of 300 $\mu\Omega cm$, a reflectivity of 50% at 5500 angstroms and a thickness uniformity of ±5%. The plasma was terminated after about 15 seconds. Thus, the plasma is used only to initiate or to nucleate the layer of tungsten disilicide.

There is thus provided by the present invention a substantially improved plasma reactor for the chemical vapor deposition of various materials. The wafer is efficiently heated radiantly and the temperature of the wafer is simulated to provide control of the deposition. The control of temperature and gas uniformity and the internal baffle of the reactor assure good uniformity of the deposited layer. In addition, a rapid deposition is obtained.

Having thus described the invention it will be apparent to those of skill in the art that various modifications can be made within the spirit and scope of the present invention. For example, while reactor 10 preferably comprises stainless steel for the conductive members and quartz for the insulating member other materials can be used such as Inconel, graphite, or ceramics. Since programmable logic is used, other features can be added, e.g. a test for filament continuity can be easily made. A failure of this test would cause the process to terminate since the deposition would be uneven. While the sustaining power level is pre-programmed, one can readily add another threshold sensor and control the temperature dynamically with CPU 91 in a feedback loop. While illustrated as connected in parallel with a single control circuit, it is understood that each lamp may require its own control circuit due to the high power dissipation of the lamps.

I claim:

1. Apparatus for chemical vapor deposition comprising:
    an evacuable chamber having a thermally translucent window;
    heater means positioned outside said chamber and adjacent said window, said heater means comprising at least one incandescent lamp;
    temperature sensing means, located in said heater means, for producing an electrical signal indicative of temperature;
    transducer means for converting the signal from said sensing means into a digital signal;
    control means connected to said transducer means and to said at least one lamp for initially applying full power to said lamp and then a lower, temperature sustaining power to said lamp during a chemical vapor deposition process in said chamber.

2. The apparatus as set forth in claim 1 wherein said transducer means comprises threshold sensing means.

3. The apparatus as set forth in claim 1 wherein said digital signal comprises two bits.

4. The apparatus as set forth in claim 3 wherein said transducer means comprises two threshold sensing means for sensing a first signal level indicating full power is to be applied and a second signal level indicating a sustaining power is to be applied.

5. The apparatus as set forth in claim 1 wherein said control means comprises
    programmed microprocessor means for receiving said digital signal as a data input;
    interface means connected to a data output of said microprocessor; and
    switch means connected to said interface means and to said lamp for controlling the current through said lamp.

* * * * *